(12) United States Patent
Browning et al.

(10) Patent No.: US 6,429,835 B1
(45) Date of Patent: *Aug. 6, 2002

(54) METHOD AND APPARATUS FOR TESTING EMISSIVE CATHODES

(75) Inventors: Jim Browning; Charles M. Watkins; David A. Cathey, all of Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/201,490

(22) Filed: Nov. 30, 1998

Related U.S. Application Data (63) Continuation of application No. 08/931,097, filed on Sep. 15, 1997, which is a division of application No. 08/921,772, filed on Aug. 15, 1997, now Pat. No. 5,751,262, which is a continuation of application No. 08/383,269, filed on Feb. 3, 1995, now abandoned, which is a continuation-in-part of application No. 08/377,320, filed on Jan. 24, 1995, now abandoned.

(51) Int. Cl.[7] .......................... G09G 3/22; G01R 31/00; H01J 1/02
(52) U.S. Cl. .......................... 345/74; 345/75; 313/310; 324/754; 324/770
(58) Field of Search .......................... 345/74, 75, 904; 313/308–311; 315/169.1, 169.2, 169.3, 169.4; 445/2; 324/754, 755, 770

(56) References Cited

U.S. PATENT DOCUMENTS

| 3,755,704 A | 8/1973 | Spindt et al. ............... 313/309 |
| 4,763,187 A | 8/1988 | Biberian ...................... 358/56 |
| 5,008,657 A | 4/1991 | Hanson et al. ............... 345/74 |
| 5,015,912 A | 5/1991 | Spindt et al. ............... 313/495 |

(List continued on next page.)

FOREIGN PATENT DOCUMENTS

| WO | WO85/05491 | 5/1985 |

OTHER PUBLICATIONS

Schwoebel, et al., "Field–Emitter Array Performance Enhancement Using Glow Discharge Processing", IVMC Technical Digest, Jul. 12–15, 1993, p. 14.
Sokolich, et al., "A Study of the Emission Characteristics of All–metal Cold Cathodes", IVMC Technical Digest, Jul. 12–15, 1993, pp. 19,20
R. Cummins et al., "Evaluating Image Quality and Defect Characterization Flat–Panel", Journal, pp. 29–32.
Francois Henley et al., "A High Speed Plat Panel In–Process Test System for TFT Array Using Electro–Optic Effects", Journal, pp. 64–67.
Glenn D. Houser, "In–Process Testing of LCD Panels by Voltage Imaging TM: Methods and Capabilities", Journal.
Brochure, "FIS Flat Panel Inspection System", Photon Dynamics.
Heinz H. Busta, "Vacuum microelectronics—1992", Journal, pp. 43–74.
M. Miller et al., "A Flat–Panel–In–Process Test System Using Voltage Imaging", Journal, pp. 27–31.
J. R. Monkowski et al., "Detection and Measurement of Low Contrast Mura Defects in Flat–Panel Displays", Journal, pp. 51–52.

*Primary Examiner*—Bipin Shalwala
*Assistant Examiner*—David L Lewis
(74) *Attorney, Agent, or Firm*—Schwegman, Lundberg, Woessner & Kluth, P.A.

(57) ABSTRACT

A method of electrically testing pixel functionality is provided comprising releasably disposing a wafer in a socket. The wafer has at least one baseplate comprised of cathode emitters arranged in pixels. The socket has pads. The socket pads are contacted with test pins, and each of the pixels is addressed individually, thereby causing the cathode emitters to emit electrons in a current. The current is collected from each of the pixels on an anode screen. Alternatively, the anode card may have pins, and these pins contact pads on the baseplate. The baseplate, or substrate with baseplates, does not require a socket with pins.

28 Claims, 6 Drawing Sheets

U.S. PATENT DOCUMENTS

| | | | |
|---|---|---|---|
| 5,103,144 A | 4/1992 | Dunham | 315/366 |
| 5,138,237 A | 8/1992 | Kane et al. | 315/349 |
| 5,172,053 A | 12/1992 | Itoyama | 324/158 F |
| 5,262,698 A | 11/1993 | Dunham | 315/169.1 |
| 5,283,500 A | 2/1994 | Kochanski | 315/169.3 |
| 5,300,862 A | 4/1994 | Parker et al. | 345/74 |
| 5,336,992 A | 8/1994 | Saito et al. | 324/754 |
| 5,374,868 A * | 12/1994 | Tjaden et al. | 313/310 |
| 5,382,961 A | 1/1995 | Gale, Jr. | 345/904 |
| 5,432,461 A | 7/1995 | Henley | 345/904 |
| 5,459,410 A | 10/1995 | Henley | 345/904 |
| 5,459,480 A * | 10/1995 | Browning et al. | 345/75 |
| 5,491,427 A | 2/1996 | Ueno et al. | 324/754 |
| 5,541,478 A | 7/1996 | Troxell et al. | 345/75 |
| 5,542,866 A | 8/1996 | Tsai | 445/2 |
| 5,638,086 A | 6/1997 | Lee et al. | 345/74 |
| 5,721,472 A * | 2/1998 | Browning et al. | 345/74 |
| 5,730,634 A | 3/1998 | Seko | 445/3 |
| 5,751,262 A * | 5/1998 | Browning et al. | 345/75 |
| 5,836,799 A | 11/1998 | Levine et al. | 445/24 |
| 5,909,203 A * | 6/1999 | Browing et al. | 345/75 |
| 5,942,849 A | 8/1999 | Cade | 313/495 |
| 6,064,217 A | 5/2000 | Smith | 324/760 |

* cited by examiner

METHOD AND APPARATUS FOR TESTING EMISSIVE CATHODES

This application is a continuation of U.S. patent application Ser. No. 08/931,097, filed Sep. 15, 1997, which is a division of U.S. patent application Ser. No. 08/921,772, filed Aug. 15, 1997 (now U.S. Pat. No. 5,751,262), which is a continuation of U.S. patent application Ser. No. 08/383,269, filed Feb. 3, 1995 (now abandoned), which is a continuation-in-part of U.S. patent application Ser. No. 08/377,320, filed Jan. 24, 1995 (now abandoned).

This invention was made with Government support under Contract No. DABT63-93-C-0025 awarded by the Advanced Research Projects Agency (ARPA). The Government has certain rights in the invention.

FIELD OF THE INVENTION

This invention relates to matrix addressable display devices, and more particularly to a method and apparatus for testing the emission of the display.

BACKGROUND OF THE INVENTION

Quality assurance requires the testing of manufactured products to determine if they will function over a given set of parameters. Testing is performed on a random sampling of products from the production lines, or in some industries, on every product which is manufactured.

Optical measurements are currently performed on display devices at the final stages of display testing. Optical measurement is accomplished by turning on all the cathode emitters in a pixel, and visually observing them. This method is extremely subjective, as it relies on the judgement of the individual peering at the screen.

Photon Dynamics of Milipitas, Calif. employs a method in which photons from a full display (i.e., substantially all of the pixels are turned "on" at the same time) are measured. A completed display device is optically tested by measuring the light emitted from the display.

There are several drawbacks to the above described optical method. For example, the process is very expensive, as it requires sophisticated optics and processing algorithms in order to determine the relative number of functional pixels.

Additionally, the optical systems require closely spaced anodes with respect to the cathode in order for the inspection optics to obtain accurate measurements. Therefore, the optical systems are not practical for testing display baseplates prior to their assembly in a field emission device.

Other methods used to measure current emitted by field emitter devices employ a positively biased electrode. However, these methods also measure the total current emitted by substantially all of the pixels in the completed unit. Therefore, these methods are also limited to measuring the operation of the device as a whole.

There still exists a need for a method to measure the current emitted by individual pixels in the display in order to determine their functionality, as well as the total number of functioning pixels (also known as the "yield"). Additionally, manufacturing realities require that the functionality of the individual pixels is measured in a rapid fashion.

SUMMARY OF THE INVENTION

The functionality of individual pixels in an addressable emissive cathode is determined by measuring the emitted current from a single pixel or from a small group of pixels. The current is measured on an anode screen disposed above the cathode emitters, thereby enabling the anode to collect electrons emitted from the cathodes. The collected current is compared to known parameters in order to determine whether the individual pixel site is functional.

The method of the present invention allows for the testing of cathode emitters in a vacuum chamber through the use of probe cards or sockets, and an anode. This format allows for the testing of approximately 100,000 pixels in less than 30 seconds, thereby expanding testing capabilities. Not only does the present technique permit faster testing, but also a less expensive alternative to the functionality tests used for individual pixels.

One advantage of the test method of the present invention is that it enables rapid determination of individual pixel functionality of the cathode emitters used in field emission type displays, or other similarly addressed matrix displays. For example, the present test method is suitable for displays that are actively or passively addressed.

The method of the present invention permits testing of the cathode emitters as a baseplate. Additionally, the use of an anode which luminesces under electron bombardment permits the measurement of emitted photons to determine pixel functionality.

The present invention is employed to sequence through all of the pixels, one or more at a time. Additionally, there is no required spacing for the anode in order to achieve accurate measurement. Further the present invention can be used with current optical methods to enhance the value of those methods.

One aspect of the invention comprises a method of electrically testing pixel functionality which comprises releasably disposing a wafer in a socket. The wafer has at least one baseplate comprised of cathode emitters arranged in pixels. The socket has pads. The socket pads are contacted with test pins, and each of the pixels is addressed individually, thereby causing the cathode emitters to emit electrons in a current. The current is collected from each of the pixels on an anode plate.

Another aspect of the invention comprises an anode card useful for measuring emitted current which comprises: a socket in which to dispose a substrate having cathodes; an anode disposed opposite the socket for collecting emissions from the cathodes, a high vacuum existing between the socket and the anode; and contact pins disposed on the anode for making contact with the substrate.

A further aspect of the invention comprises an apparatus useful for testing emissive cathodes comprising: a transparent collector having phosphors disposed thereon, and a wafer support device for releasably supporting a wafer opposite the transparent collector. The socket has contact pins for contacting the wafer. A high vacuum exists between the transparent collector and the wafer support device.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
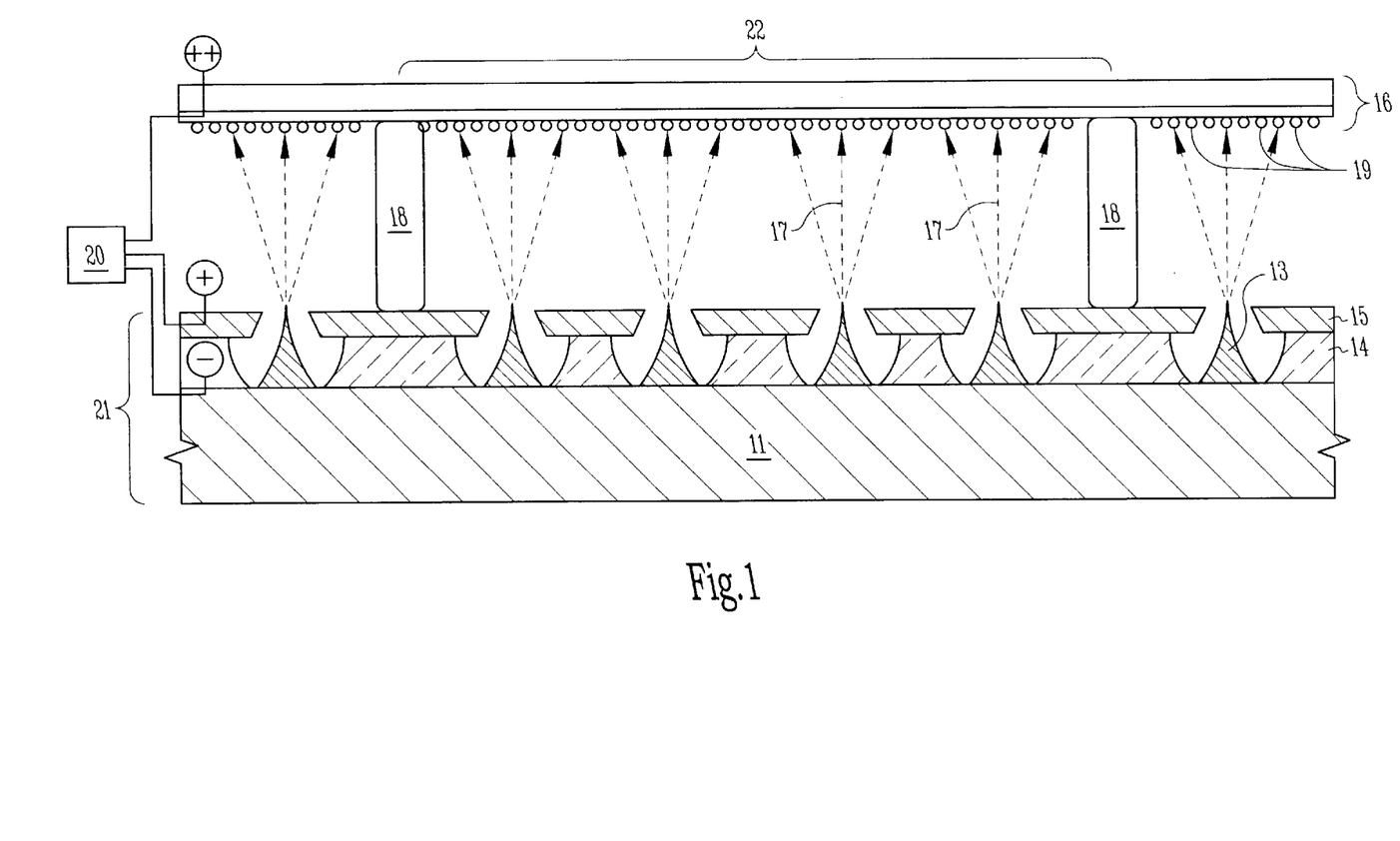
FIG. 1 is a schematic cross-section of a pixel of an illustrative field emission display having emitter tips.

Referring to FIG. 1, a representative field emission display employing a display segment 22 is depicted. Each display segment 22 is capable of displaying a pixel of information, or a portion of a pixel, as, for example, one green dot of a red/green/blue full-color triad pixel.

Preferably, a single crystal silicon layer serves as a substrate 11. Alternatively, amorphous silicon deposited on an underlying substrate comprised largely of glass or other combination may be used as long as a material capable of conducting electrical current is present on the surface of a substrate so that it can be patterned and etched to form micro-cathodes 13.

At a field emission site, a micro-cathode 13 has been constructed on top of the substrate 11. The micro-cathode 13 is a protuberance which may have a variety of shapes, such as pyramidal, conical, or other geometry which has a fine micro-point for the emission of electrons. Surrounding the micro-cathode 13, is a grid structure 15. When a voltage differential, through source 20, is applied between the cathode 13 and the grid 15, a stream of electrons 17 is emitted toward a phosphor coated screen 16. Screen 16 is an anode.

The electron emission tip 13 is integral with substrate 11, and serves as a cathode. Gate 15 serves as a grid structure for applying an electrical field potential to its respective cathode 13.

A dielectric insulating layer 14 is deposited on the conductive cathode 13, which cathode 13 can be formed from the substrate or from one or more deposited conductive films, such as a chromium amorphous silicon bilayer. The insulator 14 also has an opening at the field emission site location.

Disposed between said faceplate 16 and said baseplate 21 are located spacer support structures 18 which function to support the atmospheric pressure which exists on the electrode faceplate 16 as a result of the vacuum which is created between the baseplate 21 and faceplate 16 for the proper functioning of the emitter tips 13.

The baseplate 21 of the invention comprises a matrix addressable array of cold cathode emission structures 13, the substrate 11 on which the emission structures 13 are created, the insulating layer 14, and the anode grid 15.

The present invention provides a method and apparatus useful for testing cathodes emitters, which cathode emitters are frequently used in field emitter display devices. The testing procedure of the present invention is discussed in terms of field emission displays. However, one having ordinary skill in the art, upon being apprised of the present invention will realize its applicability to other matrix addressable displays or devices having emissive cathodes.

The field emitter displays have cathode emission structures 13 which emit electrons into a vacuum environment. For purposes of display devices, the electrons are collected on an anode 16 which is coated with phosphors 19. The phosphors 19 luminesce under electron 17 bombardment, thereby creating the colored light which forms the displayed image.

Figure 2A:
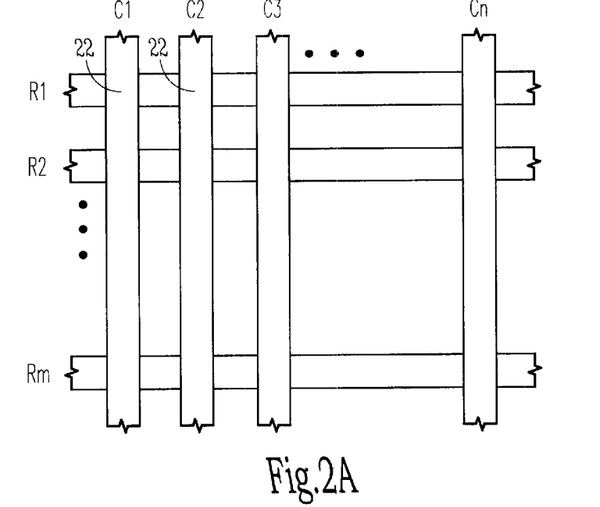
FIGS. 2A–C are schematic top-views of the field emission display illustrating the relative location of the pixels of FIG. 1, illustrating a testing sequence, according to the present invention.
Figure 2B:
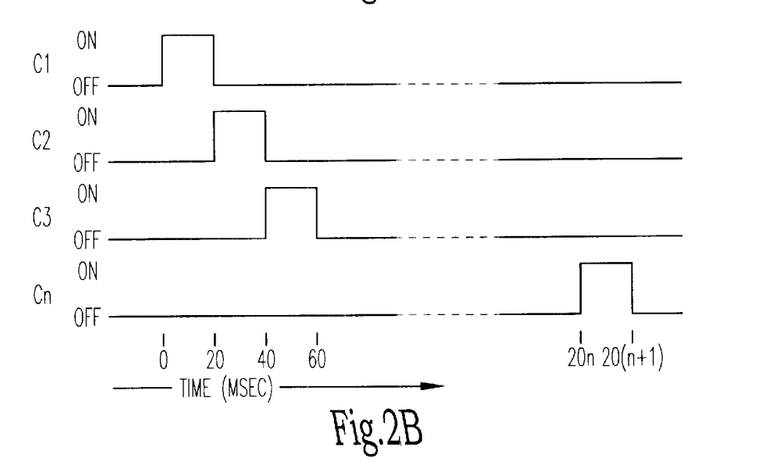
Figure 2C:
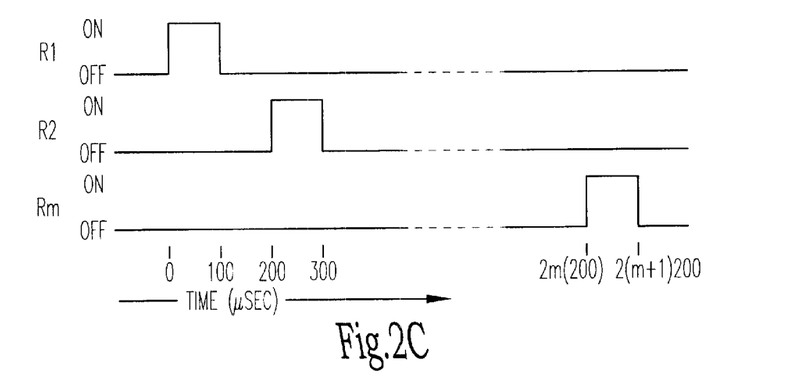

During the operation of the display, individual pixels 22 are turned on, so that the pixels 22 emit a controlled amount of current. Each pixel contains one or more cathode emitter structures 13. FIGS. 2A–C illustrate that the control of the pixels 22 is accomplished by a matrix addressable system of rows $R_1 \ldots R_m$ and columns $C_1 \ldots C_n$. Pixel sites 22 are disposed at the intersection of the rows and columns, and are thereby addressable by their location. In this manner, individual pixels 22 are addressable one or more at a time.

A knowledge of the yield of pixels on the baseplate 21 is essential to the production of field emission displays and other devices. Statistically relevant information can only be obtained by measuring the functionality of every pixel at the earliest opportunity. This information is needed to provide feedback for process modification, trouble shooting, and yield enhancement.

The inability to test baseplates 21 means that yield analysis and process problems remain unknown until the assembly and testing of the completed display. This is a costly approach as defective baseplates are processed into a complete display before the problem is identified. The feedback to the fabrication process is limited by the additional process steps, and by increasing the time until the defects are discovered.

The test method of the present invention is performed by turning on all of the pixels of the cathode 12 for "burn in," and to establish an equilibrium. "Burn in" refers to stressing the devices through electrical cycling, thereby causing any defective parts to fail.

The drive cycle is started in which individual pixels are turned on one at a time or in small groups. This application will refer to the pattern of addressing the pixels 22 as "sequencing," and it is to be understood that the pixels 22 are addressable in a variety of patterns or in a row or column. Sequencing through the pixels 22 enables all of the pixels 22 to be addressed and tested for functionality.

The drive cycle is illustrated in FIGS. 2A–C. A column ($C_1$) is turned on, as well as a row ($R_1$), thereby causing the pixel 22 located at their intersection to emit electrons 17. The emitted electrons create a current which is collected on an anode plate 16 disposed above the cathode emitters 13. The anode 16 has a positive bias with respect to the cathodes 13, thereby enabling the anode 16 to collect the electrons 17.

Figure 3:
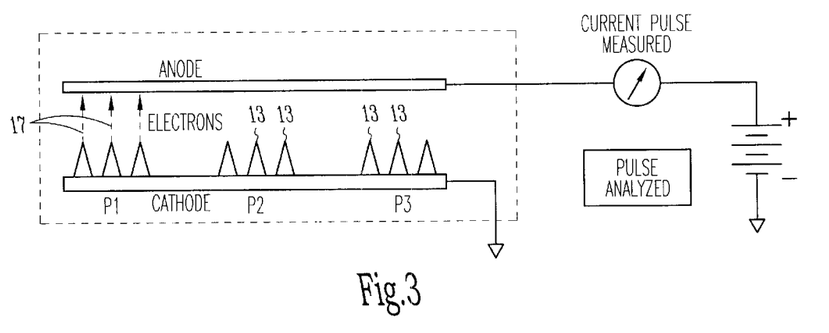
FIG. 3 is a schematic cross-section of the pixels of FIG. 2, illustrating an electrical method used to test the current of the pixels, according to the present invention.

The collected current is measured and compared with known data for good pulse current. See, for example, FIG. 3. The current magnitude is measured to determine whether the current is above or below the known value. Alternatively, the shape of the pulse (rise time, fall time, etc.) is measured to determine whether the pixel 22 responds properly in a given time frame.

The measurement techniques include coupling the current through a capacitor; measuring the voltage across a resistor; or directly measuring the current through a power source. The method chosen varies with the amount of anode voltage used, the size of the current pulse, and the speed with which the measurement is taken.

After the current from the first pixel is measured, a second pixel in the same or another column is addressed. The current from the second pixel is measured, and the process is repeated until all of the pixels have been measured.

A delay time between each measurement is incorporated to allow for data processing, and for decay of the pulse when the time response of the system is slow. For example, pixel ($P_1$) is turned on for 100 μsec. After which no pixel is turned on for 100 μsec. Then pixel ($P_2$) is turned on for 100 μsec, and so on. Using this 200 μsec. total time (i.e., pulse plus delay time), the system is capable of measuring approximately 100,000 pixels in about 20 seconds. This is especially useful in displays having more than 10,000 pixels.

Of course, depending on the size of the baseplate 21 and the number of pixels thereon, the timing of the individual pixel test may vary. The preferable range for pulse plus delay is approximately 10 μsec to 10 msec.

This is quite a significant advancement over the visual inspection methods currently used, as the present method enables the electrical testing of substantially every pixel 22 individually, and in a rapid fashion.

Non-functional pixels appear as black spots in the display. It only takes a small number of non-functional pixels to cause a display to be non-marketable. Hence, it is worthwhile to know whether the baseplate 21 has defective pixels before completing the assembly of the display device.

The amount of time required for the test varies with the amount of time needed to measure the pulse, the time needed for the pulse to reach equilibrium and decay, and the time needed to process the data. However, the test method of the present invention is independent of address method (e.g., passive or active circuitry) or current regulation schemes.

In an alternative embodiment, multiple pixels are turned on at the same time. For example, one desires to test a group of five pixels. In such a case, four of the pixels are turned on at the same time (e.g., $P_1$, $P_2$, $P_3$, $P_4$), and one pixel ($P_5$) remains off, and the current emitted is measured. Then, a different subset of the same five pixels is turned on (e.g., $P_1$, $P_2$, $P_3$, $P_5$), and a different one of the pixels remains off ($P_4$), and the current is measured. Preferably, the number of pixels 22 tested at one time is less than 10.

The current emitted from the first subset is then compared with that of the second subset, or with the current from a subset known to contain working pixels. Then as different combinations of pixel groups are turned on, the functionality of those pixels is determined from the expected value.

This approach is especially useful in those situations where the current emitted from one pixel 22 is so small that accurate measurement is difficult due to background noise in the system. In this embodiment, the total current measured is larger because several pixels are tested at once.

Additionally, using the above-described approach, it is possible to measure the total current emitted from a group of pixels. So, a bulk value is obtained for a specified number of pixels. The total value is compared to a known or expected value. The measurement determines whether a particular group of pixels is non-functional. This is useful when the there is a low current emitted per pixel 22, but it does not involve the sorting of the combination measurement as in the above described approach.

The measurement techniques of the present invention include testing either baseplates 21 which are disposed in a vacuum environment with a separate anode or an integrated anode 16.

Figure 4:
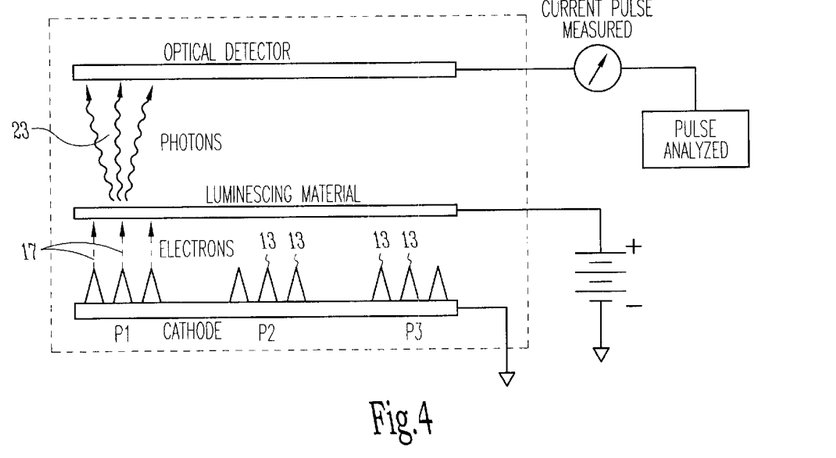
FIG. 4 is a schematic cross-section of the pixels of FIG. 2, illustrating an optical method used to test the photons emitted by the pixels, according to the present invention.

The testing scheme of the present invention is repeatable with optical, as opposed to electrical measurements. The anode 16 is coated with a material, preferably a phosphor 19, that luminesces under electron bombardment 17. An optical detector, such as a photodiode, is disposed over the anode 16. When the electrons from a pixel 22 or group of pixels cause the anode 16 to luminesce, the photons 23 are measured by the detector, and the information is recorded, as illustrated in FIG. 4.

As with the electrical measurements previously described, the magnitude, shape, rise time, and duration of the pulse are parameters which can be compared to those of a known good pulse, thereby allowing the pixel functionality to be determined. As with the other methods, this embodiment is useful in assembled displays, or with cathode emitters disposed in a vacuum. However, a difference in the timing sequence is present, as it would depend on the decay time of the luminescing material, as well as the frequency response time of the detector used.

Figure 5:
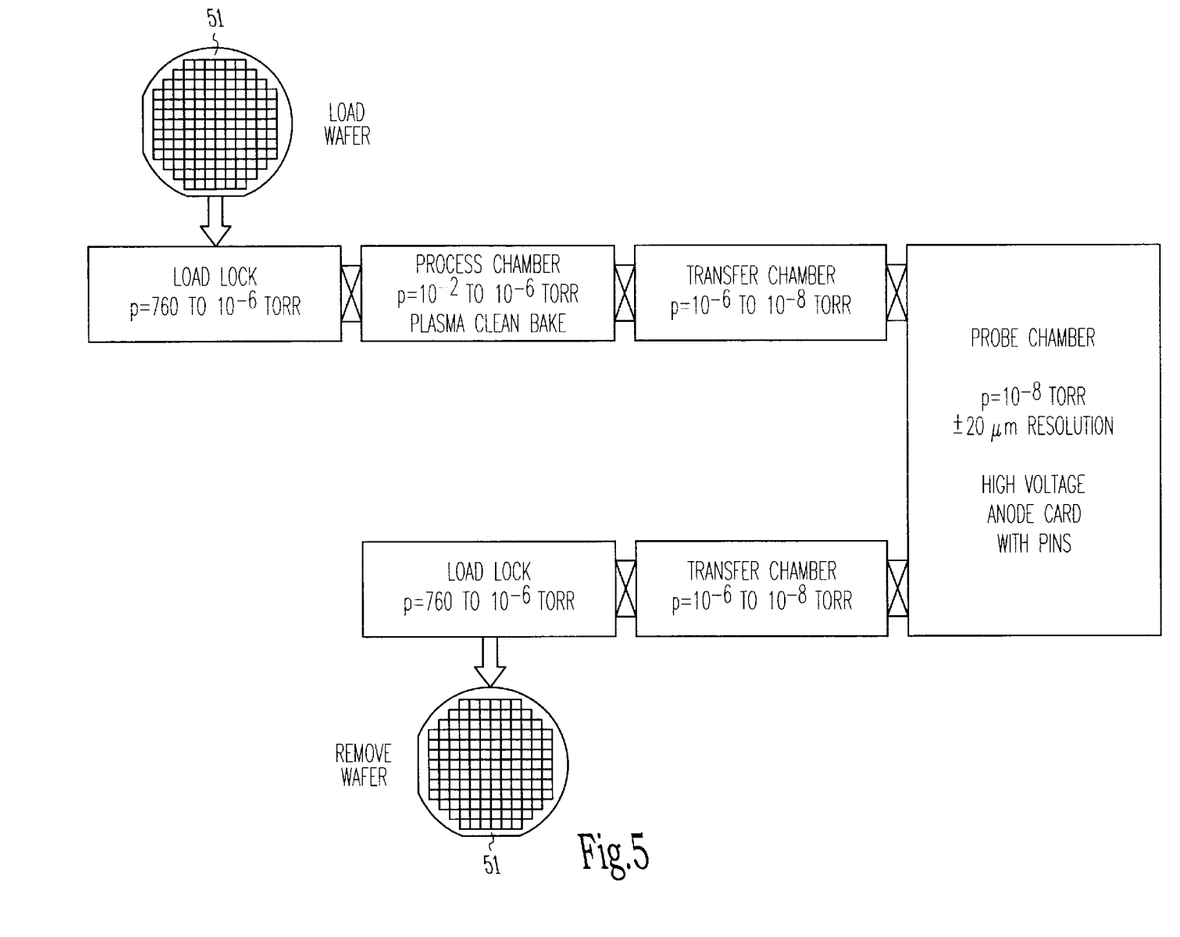
FIG. 5 is a flow chart illustrating the process of pixel testing according to the process of the present invention.

FIG. 5 is a flow-chart which depicts the flow of a wafer or substrate through the test apparatus of the present invention. Although testing is possible on individual baseplates, a more efficient and cost-effective approach is to test the device while it is still in wafer form. This allows higher throughput and reduces the cost by eliminating the processing of defective baseplates 21.

Any practical evaluation of a field emission device, must be done under vacuum. The quality of the vacuum affects the performance and the lifetime of field emitters 13. A pressure of $1 \times 10^{-8}$ Torr is desired for testing procedures. In addition, some form of cleaning or baking is also desired.

Because silicon tips 13 are often used in field emission devices, oxidation of the silicon affects the emission characteristics. The oxide layer increases the work function, and thus, increases the required operating voltage. The current at a given voltage increases dramatically after burn-in. This is the result of the removal of the oxide from the tip. Therefore, some processing of the wafer, such as a hydrogen plasma clean, is preferred prior to testing.

A vacuum bake has been found to improve performance in other emitter types. This is due to the removal of adsorbates which increase the work function. Removal of the adsorbates also reduces the likelihood that the emitters 13 will fail.

Die or baseplates 21 are pre-tested for shorts or other defects. The pre-testing is performed at a station at atmospheric pressure. The die is loaded into a high tolerance fixture which is vacuum, plasma, and high temperature compatible.

The fixtured die is loaded into a processing station which includes chambers for pump down, plasma scrub, vacuum bake, and/or other suitable preparation processes, after which the die is transferred to a testing chamber.

One embodiment of the present invention comprises a probe assembly, referred to as an "anode card," comprises electrical connections corresponding to emission control pads. An integrated anode plate or phosphor screen is aligned to the fixture containing the device or die under test (DUT). Electrical connections are releasably made to the die under test, and each emitter or group of emitters is tested for emission characteristics. Springs are preferably used to hold the die in position during test. The fixtured die are removed form the test chamber, and the die having satisfactory characteristics are packaged into a display device, for example.

The ability to remove the die from the socket after the testing process is a significant improvement over the known methods. This enables the die to be tested before it is assembled into a completed display. Prior to the development of the present invention, baseplates were hard-wired or otherwise processed to in order for testing to be undertaken. The hard-wiring implies that the display has to be completely assembled.

Another embodiment of the present invention comprises an automated ultra-high vacuum wafer probe station. The probe station comprises a load-lock which handles a cassette of wafers. A single wafer is loaded into the ultra-high vacuum transfer chamber on a transfer trolley. The wafer is then loaded into a clean chamber where a combination of plasma clean and/or vacuum bake is performed. The wafer is then moved through the transfer chamber to a probe chamber where the wafer is clamped and staged for testing. The wafer staging system has an x, y, and z axis and rotational movement.

The wafer is aligned to a probe card having pins; the a number of pins varies with type and size of display. For example, if the baseplate has built-in driver circuitry 5–30 pins may be required. If it has no circuitry, thousands of pins are required. The wafer is raised until the pins make electrical connection to bond pads. The bond pads have a size substantially in the range of 100×100 µm. The preferred movement resolution is +/−20 µm. The probe card of the present invention, hereinafter referred to as an "anode card," also comprises an anode plate which is preferably glass coated with film and a phosphor. The phosphor film is preferably transparent, such as indium oxide, tin oxide, and indium tin oxide. However, other coatings such as chromium nickel and aluminum can also be used.

The phosphor is used to provide visual verification of emitter operation and emitter burn-in. The anode is preferably transparent to allow visual alignment of the card. Alternatively, other conductors known in the art may be used as anodes. Some of these conductors will be opaque. The anode is preferably disposed approximately 1000 µm above the wafer, and preferably biased at 2000–3000V, but may be biased from 500V to 30,000V.

In the case of a separate anode, the position of the anode must be close enough that the electrons bombard only the anode, in order to prevent static noise or charging and breakdown of the insulators. Once the card is aligned to a reference die on the wafer, the automated testing system tests the baseplate of the first die, and then moves onto the next die on the wafer.

Figure 6A:
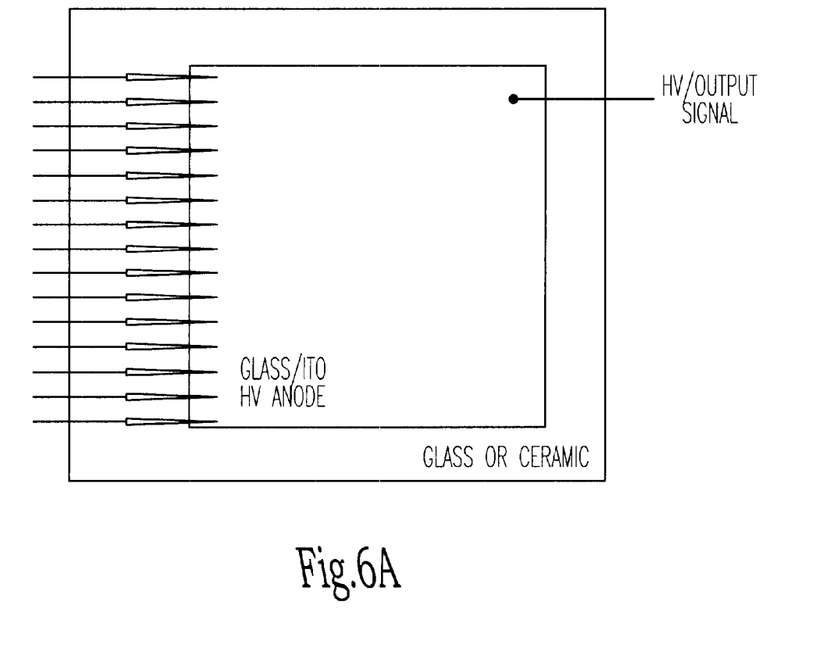
FIGS. 6A–B are schematic views of an anode card, with the pins on the anode according to the present invention.
Figure 6B:
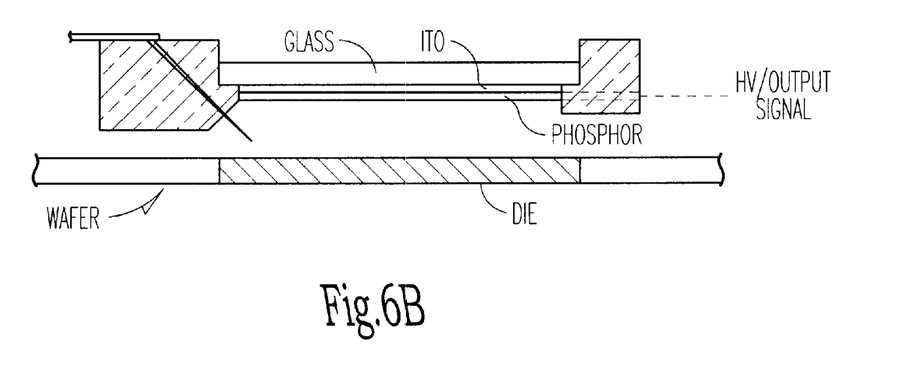
Figure 7A:
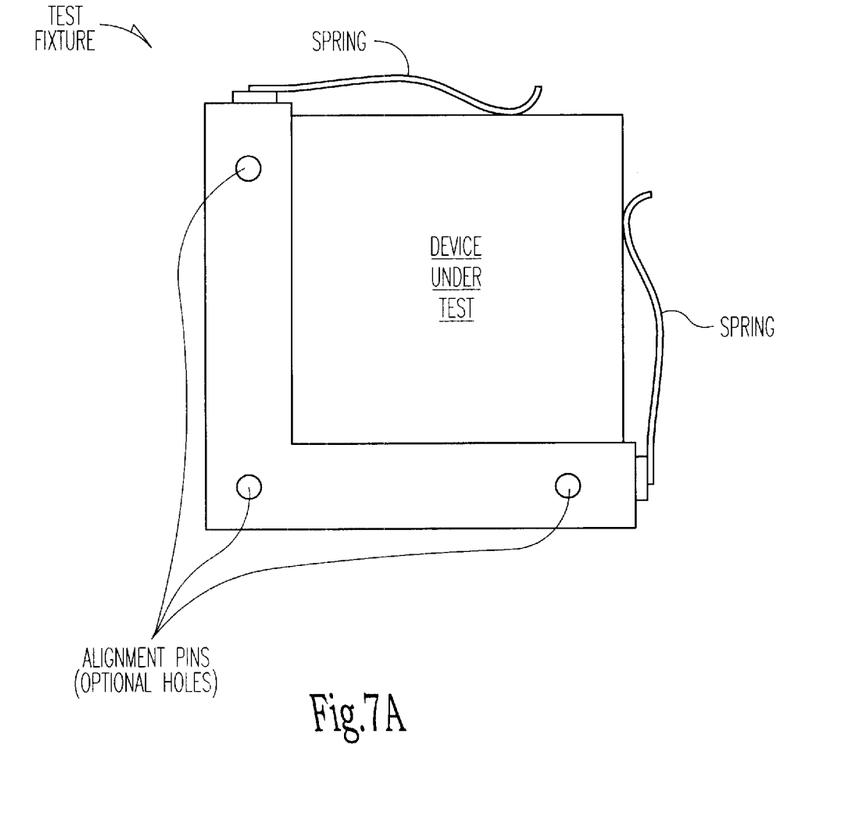
FIGS. 7A–B are schematic views of the anode card with the pins on the socket, according to the present invention.
Figure 7B:
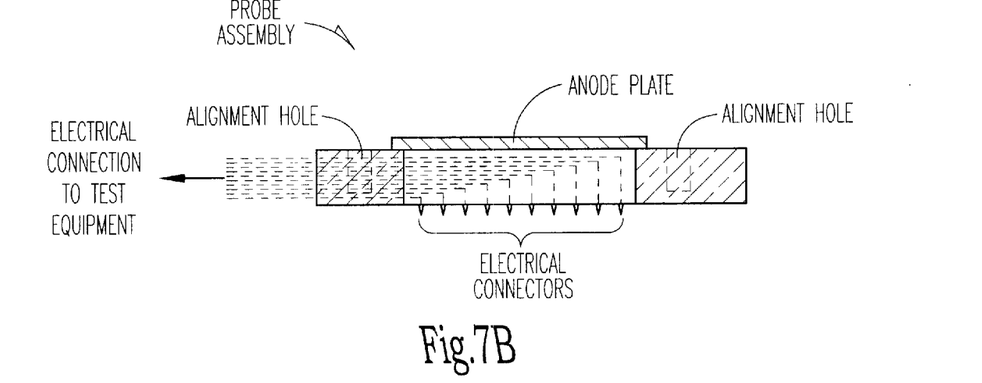

FIGS. 6 and 7 illustrate the anode assemblies of the present invention. The anode card comprises a phosphor coated anode, and contact pins all under high vacuum.

If more than 5 bad pixels are found in a baseplate, or if there are a few closely spaced defective pixels, the die will be considered defective, and testing of that die will cease. A re-check may alternatively be performed.

The analysis is performed by measuring the current pulse on the anode and comparing that with the pulse of a known good pixel. The testing procedure of the present invention provides a high speed approach to pixel yield analysis, which was previously unavailable. The testing procedure of the present invention greatly increases the viability of field emission displays by improving yield analysis, and providing feedback for process development.

To further speed up the process, the anode is divided into segments, so that more than one pixel is tested at a time. Alternatively, multiple probe card assemblies are used to test more than one die at a time.

The wafer is removed from the socket, and processing of the display or other device proceeds.

All of the U.S. patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art will realize that the testing hardware and procedures described herein are useful, with modifications, to test both individual and groups of baseplates and other devices.

What is claimed is:

1. A method for testing at least a portion of a field emission display having an isolation grid, comprising the steps of:

providing at least a portion of a display pixel, said display pixel having at least one emitter tip;

providing an anode at least partially disposed in operative alignment with said at least one emitter tip;

generating a potential difference between said anode and said at least one emitter tip;

emitting electrons from said at least one emitter tip in at least partial response to said potential difference;

at said anode, collecting at least a substantial portion of said electrons emitted;

providing said electrons collected as a current pulse; and measuring said current pulse.

2. The method of claim 1, further comprising the steps of:

providing an array address to access said at least one emitter tip to provide said potential difference thereto.

3. The method of claim 1, further comprising the steps of:

determining a magnitude of said current pulse measured; and comparing said magnitude with a test parameter magnitude.

4. The method of claim 1, further comprising:

determining a rise time of said current pulse measured; and comparing said rise time with a test parameter rise time.

5. The method of claim 1, further comprising:

determining a fall time of said current pulse measured;

comparing said fall time with a test parameter fall time.

6. The method of claim 1, wherein said anode completely covers said portion of said display pixel of said portion of said field emission display.

7. The method of claim 1, wherein said portion of said field emission display is tested while part of a wafer.

8. The method of claim 1, wherein said portion of said field emission display is optically coupled to a probe card.

9. The method of claim 8, wherein said probe card comprises an anode plate having a phosphorous film formed thereon.

10. The method of claim 1, wherein said portion of said field emission display is electrically coupled to a probe assembly.

11. The method of claim 10, wherein said probe assembly comprises an anode plate.

12. The method of claim 1, wherein said portion of said field emission display is disposed in a test fixture.

13. The method of claim 12, wherein said test fixture is disposed in a probe chamber.

14. The method of claim 13, wherein said portion of said field emission display is coupled to an anode card.

15. A method for testing field emission for a field emission display having an isolation grid, comprising the steps of:

providing display pixels, each of said display pixels having a plurality of cathode emitters;

providing an anode, said anode at least partially disposed in operative alignment with said display pixels;

selecting a first portion of said display pixels;

applying a voltage to said anode and said first portion of said display pixels;

generating a first emission from said first portion of said display pixels at least in partial response to said voltage applied;

at said anode, collecting electrons of said first emission to provide a first current pulse; and measuring said first current pulse.

16. The method of claim 15, further comprising the step of checking said first current pulse against a test parameter.

17. The method of claim 15, further comprising the steps of:

selecting a second portion of said display pixels different from said first portion of said display pixels;

applying said voltage to said anode and said second portion of said display pixels;

generating a second emission from said second portion of said display pixels at least in partial response to said voltage applied;

at said anode, collecting electrons of said second emission to provide a second current pulse; and measuring said second current pulse.

18. The method of claim 17, further comprising the step of comparing said first current pulse to said second current pulse.

19. The method of claim 17, further comprising the step of comparing said first current pulse and said second current pulse to a test parameter.

20. A method for testing at least a portion of a field emission display having an isolation grid, comprising the steps of:

providing display pixels, each of said display pixels having a plurality of cathode emitters;

providing an anode, said anode at least partially disposed in operative alignment with said display pixels;

accessing a subset of said display pixels, said subset including more than one of said display pixels;

selecting a first display pixel and a second display pixel of said subset;

applying voltage to all but said first display pixel of said subset to emit electrons from a first remainder of said display pixels;

applying voltage to all but said second display pixel of said subset to emit electrons from a second remainder of said display pixels;

at said anode, respectively collecting electrons emitted from said first remainder and said second remainder; and measuring said electrons collected as respective current pulses.

21. The method of claim 20, further comprising the step of comparing each of said current pulses to an expected value therefor.

22. The method of claim 20, further comprising the step of comparing each of said current pulses to one another.

23. A method for testing field emission of a field emission display having an isolation grid, comprising the steps of:

providing a first anode, said first anode at least partially disposed in operational alignment with a plurality of display pixels;

providing a second anode, said second anode at least partially disposed in operational alignment with said first anode;

providing a plurality of cathode emitters with each pixel of said plurality of display pixels;

selecting a first portion of said plurality of display pixels;

applying a bias voltage to said first portion of said plurality of display pixels to provide a first electron emission;

collecting at least a portion of said first electron emission at said first anode;

providing a first photon emission to said second anode in response to said collection of said first electron emission; and measuring said first photon emission as a first pulse, said first pulse indicative of said field emission of said first portion of said plurality of display pixels.

24. The method of claim 23, further comprising the steps of:

selecting a second portion of said plurality of display pixels different from said first portion of said plurality of display pixels;

applying said bias voltage to said second portion of said plurality of display pixels to provide a second electron emission;

collecting at least a portion of said second electron emission at said first anode;

providing a second photon emission to said second anode in response to said collection of said second electron emission; and measuring said second photon emission as a second pulse, said second pulse indicative of said field emission of said second portion of said plurality of display pixels.

25. The method of claim 23, further comprising the step of comparing said first pulse and said second pulse to a known value therefor.

26. The method of claim 23, wherein said first anode and said second anode are completely disposed within said plurality of display pixels.

27. The method of claim 23, wherein said first anode is a luminescent material.

28. The method of claim 27, wherein said second anode is an optical detector.

* * * * *